Oct. 13, 1970 C. E. HILLHOUSE 3,534,281

SOFT SATURATING TRANSISTOR AMPLIFIER

Filed Feb. 3, 1969

INVENTOR.
CHARLES E. HILLHOUSE
BY Floyd B. Guernsey
AGENT

United States Patent Office 3,534,281
Patented Oct. 13, 1970

3,534,281

SOFT SATURATING TRANSISTOR AMPLIFIER

Charles E. Hillhouse, Phoenix, Ariz., assignor to General Electric Company, a corporation of New York Filed Feb. 3, 1969, Ser. No. 796,017
Int. Cl. H03f 1/34
U.S. Cl. 330—28 4 Claims

ABSTRACT OF THE DISCLOSURE

Hard saturation is prevented in the transistor of a common-emitter transistor amplifier by the use of a second transistor connected between the base and collector of the first transistor.

BACKGROUND OF THE INVENTION

This invention relates to transistor amplifier circuits and more particularly to transistor amplifiers of the common emitter configuration which are capable of amplifying high frequency signals. As is well known, transistor amplifiers may be disposed in different configurations including the common collector configuration, the common base configuration and the common emitter configuration. The common emitter configuration is generally preferred because the power gain in the common emitter configuration is greater than in the common base or the common collector configuration. The common emitter configuration, however, has the disadvantage that the maximum frequency at which the amplifier can be operated is limited by the phenomenon known as saturation in which charges are stored in the semiconductor material used in the transistor. A junction transistor connected in a common emitter configuration is considered to have reached saturation when its collector-to-emitter voltage has dropped so low that it decreases only slightly to a further increase in the forward base driving potential. This occurs when the transistor junction between the base and the collector which is normally reverse biased is changed to a forward bias condition. When the collector-to-base junction is forward biased, a substantial amount of electrical charges are stored in the transistor base. When a pulse is applied to the base of the transistor to render the transistor nonconductive, an appreciable delay in response of the transistor occurs because the electrical charges from the base must be removed before the transistor can be rendered nonconductive. This delay in rendering the transistor nonconductive limits the upper frequency at which the transistor can be operated.

Many attempts have been made to avoid saturation of the transistor by using complicated and expensive circuits to eliminate or to reduce the saturation. The simplest of the prior art's circuits which prevent saturation in the transistor employs a germanium diode directly connected between the base and the collector of a silicon transistor and disposed so as to be normally reverse biased. When the voltage between the base and the collector of the transistor produces a forward bias at the base-collector junction of the transistor this same voltage produces a forward bias across the germanium diode so that the diode is rendered conductive. The diode clamps the base-collector voltage of the transistor and prevents hard saturation of the transistor. The voltage required to render the diode conductive is less than the voltage required to cause hard saturation in the transistor.

A disadvantage of this prior art circuit is that saturation does occur in the diode connected between the base and the collector of the transistor and charges are stored in the diode. When a change in potential is applied to the base of the transistor, the charges which have been stored in the diode must be removed before the switching of the transistor can occur. This causes some reduction in the frequency at which the common emitter transistor amplifier can be used even when a diode is employed between the base and the collector. Another disadvantage of the prior art diode circuit is that the diode couples signals from the base to the collector of the transistor used in the amplifier and thus, reduces the isolation between the signal-input terminal and the signal-output terminal of the amplifier.

The present invention alleviates the disadvantages of the prior art by employing a second transistor to prevent saturation of the common-emitter transistor being used by the amplifier. The emitter and base of the second transistor are connected to the collector and base of the first transistor so that the second transistor prevents saturation of the first transistor. The collector of the second transistor is connected to the emitter of the first transistor so that saturation of the second transistor is also prevented. The relatively high impedance between the emitter and the base of the second transistor also provides increased isolation between the signal-input terminal and the signal-output terminal of the transistor amplifier.

It is, therefore, an object of this invention to provide an improved transistor amplifier having means for preventing saturation.

Another object of this invention is to provide an improved transistor amplifier having means for preventing saturation and having improved isolation between the signal-input terminal and the signal-output terminal.

A further object of this invention is to provide an improved transistor amplifier having means for preventing saturation and for increasing the speed of operation.

SUMMARY OF THE INVENTION

The foregoing objects are achieved in the instant invention by providing a new and improved transistor amplifier having improved means for preventing saturation of the transistor used in the amplifier and for providing imprived isolation between the signal-input terminal and the signal-output terminal.

The amplifier uses a second transistor connected between the base and collector of the first transistor. The second transistor prevents saturation of the first transistor and also provides improved isolation between the signal-input terminal and the signal-output terminal.

Other objects and advantages of this invention will become apparent from the following description when taken in connection with the accompanying drawings.

DESCRIPTION OF THE PRIOR ART

Figure 1:
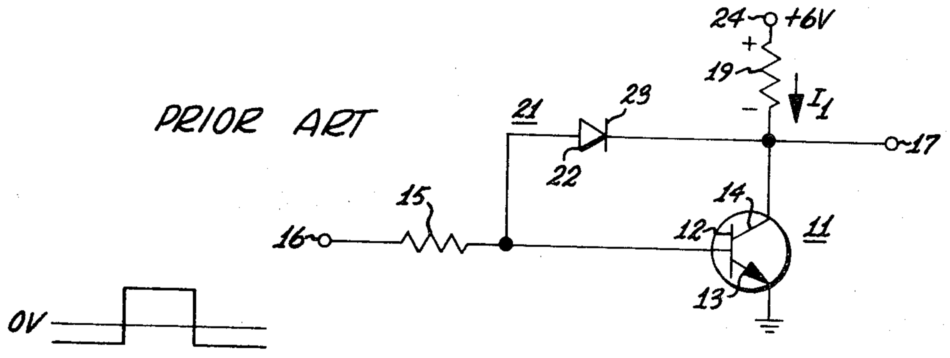
FIG. 1 is a diagram of a prior art transistor amplifier having means for preventing saturation.

The prior art circuit shown in FIG. 1 includes an NPN transistor 11 having a control electrode or base 12, a first output electrode or emitter 13 and a second output electrode or collector 14. A resistor 15 is connected between a signal-input terminal 16 and base 12 of transistor 11. A signal-output terminal 17 is connected to collector 14 of transistor 11. The collector of transistor 11 is coupled to a first reference potential or source of voltage, such as a +6 volts by a resistor 19 and the emitter of transistor 11 is connected to a second reference potential such as ground. The illustrated embodiment includes a diode 21 having an anode 22 connected to the base 12 of the transistor and the cathode 23 connected to the collector of transistor 11.

Semiconductor used in transistor such as transistor 11 employed in the amplifier circuit of FIG. 1, store electrical charges during the time a transistor is in a conductive condition. These charges must be supplied to a transistor in order to render the transistor conductive. These electical charges must be removed to render a transistor nonconductive after it has been rendered conductive. Electrical current flowing into the base of a transistor supplies electrical charges to the transistor. Electrical current flowing out of the base of a transistor removes these electrical charges from the transistor.

When a positive potential is applied to the base of the NPN transistor 11, charges flow into the base of the transistor. When the potential applied to the base of the transistor exceeds a predetermined threshold value charges flow from the base of the transistor to the emitter. This flow of charges renders the transistor conductive so that an electrical current flows from the collector to the emitter of transistor 11. A substantial amount of time is required to supply charges which causes the transistor to change from a nonconductive condition to a conductive condition and a substantial amount of time is required to remove these charges to change the transistor back to the nonconductive condition. Therefore, there is some delay between the time a voltage is applied at the input terminal 16 of the amplifier in FIG. 1 and the time a change occurs in the voltage at the output terminal 17.

When transistor 11 is rendered conductive a current $I_1$ flows from terminal 24, through resistor 19 from collector 14 to emitter 13 of transistor 11 to ground. Current $I_1$ produces a voltage drop of the polarity shown across resistor 19. The voltage drop across resistor 19 subtracts from the +6 volt potential at terminal 24 to produce the potential at collector 14. As the potential at base 12 increases the current $I_1$ increases and the potential at collector 14 decreases. When base 12 becomes more positive than collector 14, the base-collector is forward biased and a largequantity of additional electrical charges are stored at the base-collector junction of the transistor. A junction is forward-biased when a positive voltage is applied to a P type semiconductor material on one side of the junction and a negative voltage is applied to an N type semiconductor material on the other side of the junction. Transistors in common-emitter amplifier circuits which do not use diode 21 store large quantities of electrical charges and are said to be in hard saturation when the base voltage is substantially more positive than the collector voltage.

The diode 21 in FIG. 1 is rendered conductive when the anode 22 is more positive than the cathode 23 and prevents the voltage at the base 12 of transistor 11 from becoming more than a fraction of a volt more positive than the collector 14. This prevents hard saturation of transistor 11 and decreases the time required to remove the charges when the base 12 again becomes negative. However, the anode-cathode junction of the diode is forward biased when the diode is rendered conductive so that electrical charges are stored in the diode and time is required to remove these charges when anode 22 of the diode 21 becomes negative. If the quantity of charges stored in the diode could be eliminated or reduced, the frequency of signals amplified by the common-emitter amplifier could be increased.

Figure 2:
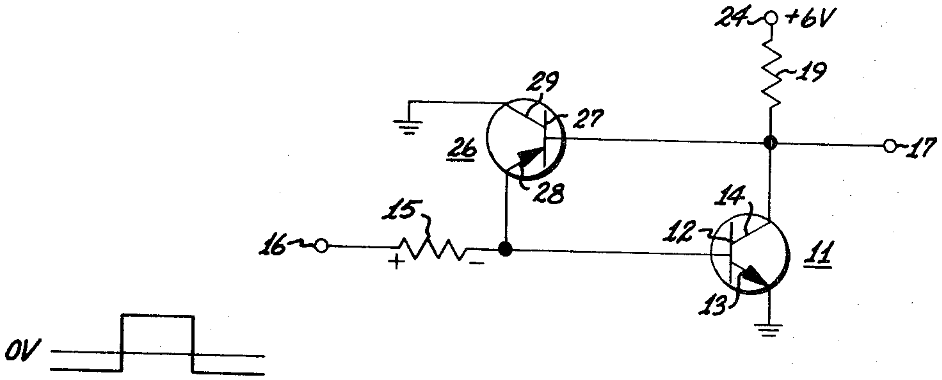
FIG. 2 is a diagram of one embodiment of the instant invention.

The instant invention shown in FIG. 2 provides a means for reducing the charges stored. The circuit in FIG. 2 includes the transistor 11 which was shown previously in FIG. 1 and includes a second transistor 26 having a control electrode or base 27, a first output electrode or collector 28 and a second output electrode or collector 29. The emitter 28 of transistor 26 is connected to the base of transistor 11 and the base of transistor 26 is connected to the collector of transistor 11. The collector of transistor 26 is connected to a suitable potential such as ground.

When a positive voltage is applied to the input terminal 16 of the circuit shown in FIG. 2, current flows from terminal 16 through resistor 15, from base to emitter of transistor 11 thereby rendering transistor 11 conductive. If the voltage at the input terminal 16 increases beyond the value which would cause the transistor 11 to saturate, saturation is prevented by current flowing from the emitter to base of transistor 26 to the collector of transistor 11 thereby rendering transistor 26 conductive. When transistor 26 is rendered conductive current flows from signal-input terminal 16, through resistor 15, from the emitter 28 to the collector 29 of transistor 26. This current through resistor 15 and transistor 26 produces a voltage drop of the polarity shown across resistor 15. This voltage drop across resistor 15 reduces the voltage at the base of transistor 11 and prevents the base-collector junction of transistor 11 from becoming forward biased. The base 27 of transistor 26 always has a positive potential and the collector is at ground potential. Thus, the base-collector junction of transistor 26 is always reverse biased so that transistor 26 does not become saturated and the number of electrical charges stored at the base-collector junction of transistor 26 is very small. The quantity of charges stored in the base of germanium transistor 26 is proportional to the value of base current in this transistor. Since most of the current which flows from input terminal 16 flows between emitter 28 and collector 29 of transistor 26, only a small fraction of the total current which flows through the diode 21 in FIG. 1 flows between emitter and base of the transistor 26 in FIG. 2 thereby storing only small number of charges in the transistor 26. The small number of charges stored in transistor 26 means that the speed of recovery of transistor 26 will be much faster than the speed of recovery of diode 21 shown in FIG. 1.

The maximum voltage drop across a forward-biased junction between an N type semiconductor material and a P type semiconductor material is approximately .3 volt when the materials are germanium, while the voltage drop across a forward-biased junction is approximately .6 volt when the materials are silicon. Thus, if the PNP transistor 26 in FIG. 2 is composed of germanium the maximum positive value of voltage between emitter 28 and base 27 is +.3 volt so that the maximum positive voltage between base 12 and collector 14 of transistor 11 is +.3 volt. Since +.6 volt is required to forward bias the base-collector junction of a silicon transistor the base-collector junction of transistor 11 can not become forward biased if it is composed of silicon. Thus, the combination of a germanium transistor 26 and a silicon transistor 11 can be employed to prevent saturation of transistor 11.

Figure 3:
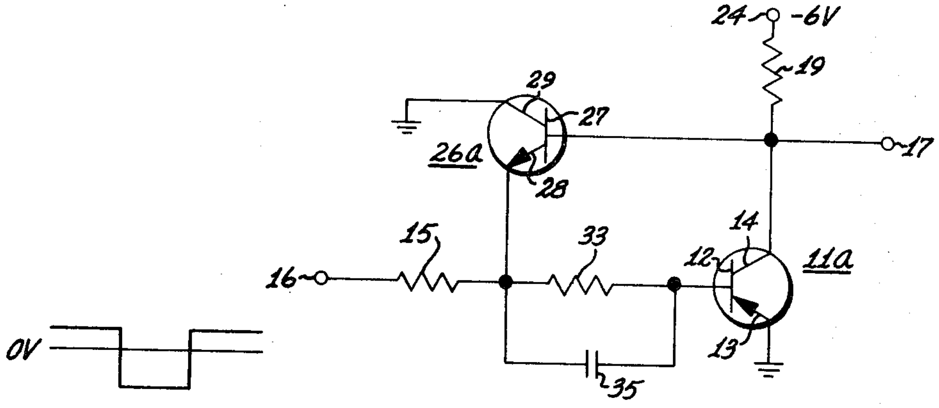
FIG. 3 is a circuit diagram of another embodiment of the instant invention.

FIG. 3 includes a common-emitter amplifier similar ti the amplifier shown in FIG. 2 except the NPN transistor 11 in FIG. 2 has been replaced by a PNP transistor **11*a* in FIG. 3 and PNP transistor 26 in FIG. 2 has been replaced by an NPN transistor 26*a*. In addition, resistor 33 has been added to limit the amount of current flowing in the transistors 11 and 26 and aid in preventing saturation in both of these transistors when large values of input signals are applied to signal-input terminal 16. A capacitor 35 has been added to increase the speed of response of transistor 11 when a pulse of voltage is applied to input terminal 16**.

While the principles of the invention have now been made clear in an illustrative embodiment, there will be immediately obvious to those skilled in the art many modifications of structure, arrangement, proportions, the elements, materials, and components, used in the practice of the invention, and otherwise, which are particularly adapted for specific environments and operating requirements without departing from those principles.

What is claimed is:

1. A transistor amplifier having means for preventing hard saturation, said amplifier comprising: A silicon transistor and a germanium transistor each having a control electrode and first and second output electrodes; first and second reference potentials, said first output electrode of said germanium transistor being connected to said control electrode of said silicon transistor, said control electrode of said germanium transistor being connected to said second output electrode of said silicon transistor, said first output electrode of said silicon transistor and said second output electrode of said germanium transistor being connected to said second reference potential; a resistor, said resistor being connected between said first potential and said second output electrode of said silicon transistor; a signal-input terminal; and a signal-output terminal, said signal-input terminal being coupled to said control electrode of said silicon transistor, said signal-output terminal being connected to said second output terminal of said silicon transistor.

2. A transistor amplifier having means for preventing hard saturation said amplifier comprising: First and second transistors each having a control electrode and first and second output electrodes; said first and said second transistors being of complementary types; first and second reference potentials, said first output electrode of said first transistor being connected to said second potential; first, second and third resistors, said first resistor being connected between said first potential and said second output electrode of said first transistor, said second resistor being connected between said control electrode of said first transistor and said first output electrode of said second transistor, said control electrode of said second transistor being connected to said second output electrode of said first transistor, said second output electrode of said second transistor being connected to said second potential; a signal-input terminal; and a signal-output terminal, said third resistor being connected between said signal-input terminal and said first output electrode of said second transistor, said signal-output terminal being connected to said second output electrode of said first transistor.

3. A transistor amplifier having means for preventing hard saturation, said amplifier comprising: A silicon transistor and a germanium transistor each having a control electrode and first and second output electrodes; first and second reference potentials, said first output electrode of said silicon transistor being connected to said second potential; first, second and third resistors, said first resistor being connected between said first potential and said second output electrode of said silicon transistor, said second resistor being connected between said control electrode of said silicon transistor and said first output electrode of said germanium transistor, said control electrode of said germanium transistor being connected to said second output electrode of said silicon transistor said second output electrode of said germanium transistor being connected to said second potential; a signal-input terminal; and a signal-output terminal, said third resistor being connected between said signal-input terminal and said first output electrode of said germanium transistor, said signal-output terminal being connected to said second output electrode of said silicon transistor.

4. A transistor having means for preventing hard saturation, said amplifier comprising: First and second transistors each having a control electrode and first and second output electrodes; a capacitor, said capacitor being connected between said control electrode of said first transistor and said first output electrode of said second transistor: First and second second reference potentials, said first output electrode of said first transistor being connected to said second potential; first, second and third resistors, said first resistor being connected between said first potential and said second output electrode of said first transistor, said second resistor being connected between said control electrode of said first transistor and said first output electrode of said second transistor, said control electrode of said second transistor being connected to said second output electrode of said first transistor, said second output electrode of said second transistor being connected to said second potential; a signal-input terminal; and a signal-output terminal, said third resistor being connected between said signal-input terminal and said first output electrode of said second transistor, said signal-output terminal being connected to said second output electrode of said first transistor, said first and said second transistors being of complementary types.

References Cited

UNITED STATES PATENTS

| | | | |
|---|---|---|---|
| 2,999,169 | 9/1961 | Feiner | 307—237 X |
| 3,105,159 | 9/1963 | Ditkofsky | 307—237 X |
| 3,160,765 | 12/1964 | Krossa | 307—300 X |
| 3,171,975 | 3/1965 | Ashley et al. | 307—268 X |
| 3,365,587 | 1/1968 | Baur | 307—300 X |

ROY LAKE, Primary Examiner

J. B. MULLINS, Assistant Examiner

U.S. Cl. X.R.

307—237, 300, 313